(12) United States Patent
Shvydun et al.

(10) Patent No.: US 8,509,014 B2
(45) Date of Patent: Aug. 13, 2013

(54) MECHANISMS FOR BUILT-IN SELF REPAIR OF MEMORY DEVICES USING FAILED BIT MAPS AND OBVIOUS REPAIRS

(75) Inventors: Volodymyr Shvydun, Los Altos, CA (US); Saman M. I. Adham, Ontario (CA)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 90 days.

(21) Appl. No.: 13/291,620

(22) Filed: Nov. 8, 2011

(65) Prior Publication Data

US 2013/0021859 A1    Jan. 24, 2013

Related U.S. Application Data

(60) Provisional application No. 61/509,832, filed on Jul. 20, 2011.

(51) Int. Cl.
*G11C 7/00* (2006.01)

(52) U.S. Cl.
USPC ............................ 365/200; 365/201; 365/154

(58) Field of Classification Search
USPC ................ 365/200, 201, 154, 230.03, 185.09
See application file for complete search history.

(56) References Cited

U.S. PATENT DOCUMENTS 7,187,603 B2 *  3/2007  Nagata et al. ................. 365/200

\* cited by examiner

*Primary Examiner* — David Lam
(74) *Attorney, Agent, or Firm* — Lowe Hauptman Ham & Berner, LLP

(57) ABSTRACT

Failure bit map (FBM) data and a built-in-self-test-repair (BISTR) module enable collecting and analyzing FBM data of an entire memory to identify the best repairing method (or mechanism) to make repairs. By performing obvious repair during collection of the FBM data, testing and date storage resources can be saved. As a result, the repair method is better and more efficient than algorithms (or methods) known to the inventors, which only utilize partial (or incomplete) failure data. The compressed data structures used for the FBMs keep the resources used to capture the FBM data and to repair the failed cells relatively limited.

20 Claims, 12 Drawing Sheets

| 331 | 332 | 333 | 334 | 335 | 336 | 337 | 338 | 339 |
|---|---|---|---|---|---|---|---|---|
| 0 | 0 | 0 | 0 | 0 | 0 | 0 | 1 | 000000001 |
| 0 | 1 | 0 | 1 | 0 | 0 | 0 | 0 | 000000010 |
| 1 | 0 | 0 | 0 | 0 | 0 | 0 | 1 | 000000011 |
| 1 | 0 | 0 | 0 | 1 | 0 | 0 | 0 | 000000111 |
| 0 | 0 | 0 | 0 | 0 | 0 | 0 | 1 | 000001000 |
| 0 | 0 | 0 | 0 | 0 | 0 | 0 | 1 | 000001001 |

330, 388

| | | | | | | | | |
|---|---|---|---|---|---|---|---|---|
| 0 | 0 | 0 | 0 | 0 | 0 | 0 | 1 | 000000001 |
| 0 | 1 | 0 | 1 | 0 | 0 | 0 | 0 | 000000010 |
| 1 | 0 | 0 | 0 | 0 | 0 | 0 | 1 | 000000011 |
| 0 | 0 | 0 | 0 | 0 | 0 | 0 | 1 | 000001000 |
| 0 | 0 | 0 | 0 | 0 | 0 | 0 | 1 | 000001001 |
| | | | | | | | | 000000111 |

340, 342, 363, 341

| 351 | 352 | 353 | 353 | 354 | 355 | 356 | 357 |
|---|---|---|---|---|---|---|---|
| 3 | 9 | 0 | 13 | 0 | 0 | 0 | 33 |
| 0 | 0 | 0 | 0 | 0 | 0 | 0 | 21 |
| 0 | 0 | 0 | 0 | 0 | 0 | 0 | 10 |
| 0 | 0 | 0 | 0 | 0 | 0 | 0 | 10 |

| 0 | 0 | 0 | 0 | 0 | 0 | 0 | 1 | 000000001 | ←360 |
|---|---|---|---|---|---|---|---|---|---|
| 0 | 1 | 0 | 1 | 0 | 0 | 0 | 0 | 000000010 | |
| 0 | 0 | 0 | 0 | 0 | 0 | 0 | 1 | 000001000 | |
| 0 | 0 | 0 | 0 | 0 | 0 | 0 | 1 | 000001001 | |
| | | | | | | | | 000000111 | |
| | | | | | | | | 000000011 | |

370

| 0 | 9 | 0 | 13 | 0 | 0 | 0 | 33 |
|---|---|---|----|---|---|---|----|
| 0 | 0 | 0 | 0  | 0 | 0 | 0 | 21 |
| 0 | 0 | 0 | 0  | 0 | 0 | 0 | 10 |
| 0 | 0 | 0 | 0  | 0 | 0 | 0 | 10 |

380

| 0 | 9 | 0 | 13 | 0 | 0 | 0 | 33 |
|---|---|---|----|---|---|---|----|
| 0 | 0 | 0 | 0  | 0 | 0 | 0 | 21 |
| 0 | 0 | 0 | 0  | 0 | 0 | 0 | 0  |
| 0 | 0 | 0 | 0  | 0 | 0 | 0 | 0  |

| 0 | 0 | 0 | 0 | 0 | 0 | 0 | 1 | 000000001 | ←390 |
|---|---|---|---|---|---|---|---|---|---|
| 0 | 1 | 0 | 1 | 0 | 0 | 0 | 0 | 000000010 | |
| | | | | | | | | 000000111 | |
| | | | | | | | | 000000011 | |
| | | | | | | | | 000001000 | |
| | | | | | | | | 000001001 | |

FIG. 3D

MECHANISMS FOR BUILT-IN SELF REPAIR OF MEMORY DEVICES USING FAILED BIT MAPS AND OBVIOUS REPAIRS

CLAIM OF PRIORITY

The present application claims the priority of U.S. Provisional Application No. 61/509,832, entitled "Mechanisms for Built-in Self Test and Repair for Memory Devices" and filed on Jul. 20, 2011, which is incorporated herein by reference in its entirety.

CROSS REFERENCES TO RELATED APPLICATIONS

The present application is related to U.S. application Ser. No. 13/291,747, entitled "Mechanisms for Built-In Self Repair of Memory Devices," and U.S. application Ser. No. 13/291,707, entitled "Mechanisms for Built-In Self Repair of Memory Devices Using Failed Bit Maps", both of which are filed on the same day of this application and are incorporated herein by reference in their entireties.

FIELD

The present disclosure relates generally to self-testing and self-repairing of memories.

BACKGROUND

Integrated circuits have become key components of many consumer and commercial electronic products, often replacing discrete components and enhancing functionality. The semiconductor processing technologies that produce these integrated circuits have advanced to the point wherein complete systems, including memories, can be reduced to a single integrated circuit, which can be an application specific integrated (ASIC) device or a system-on-a-chip (SOC) device.

Embedded random access memory (RAM) is among the most widely used cores in current ASIC or SOC implementations. Embedded RAM gives rise to problems during chip manufacturing. For example, because an embedded RAM occupies a significant portion of a chip's area, the probability that a defect lies within the RAM is relatively high. The RAM thus becomes a controlling factor in chip yield. In addition, the embedding of RAM not only makes its own testing difficult, but also impairs testability of all other functions on chip, such as the core logic.

BRIEF DESCRIPTION OF THE DRAWINGS

FIGS. 3C and 3D shows data in FBM data structures before and after obvious repairs, in accordance with some other embodiments.

DETAILED DESCRIPTION

Figure 1A:
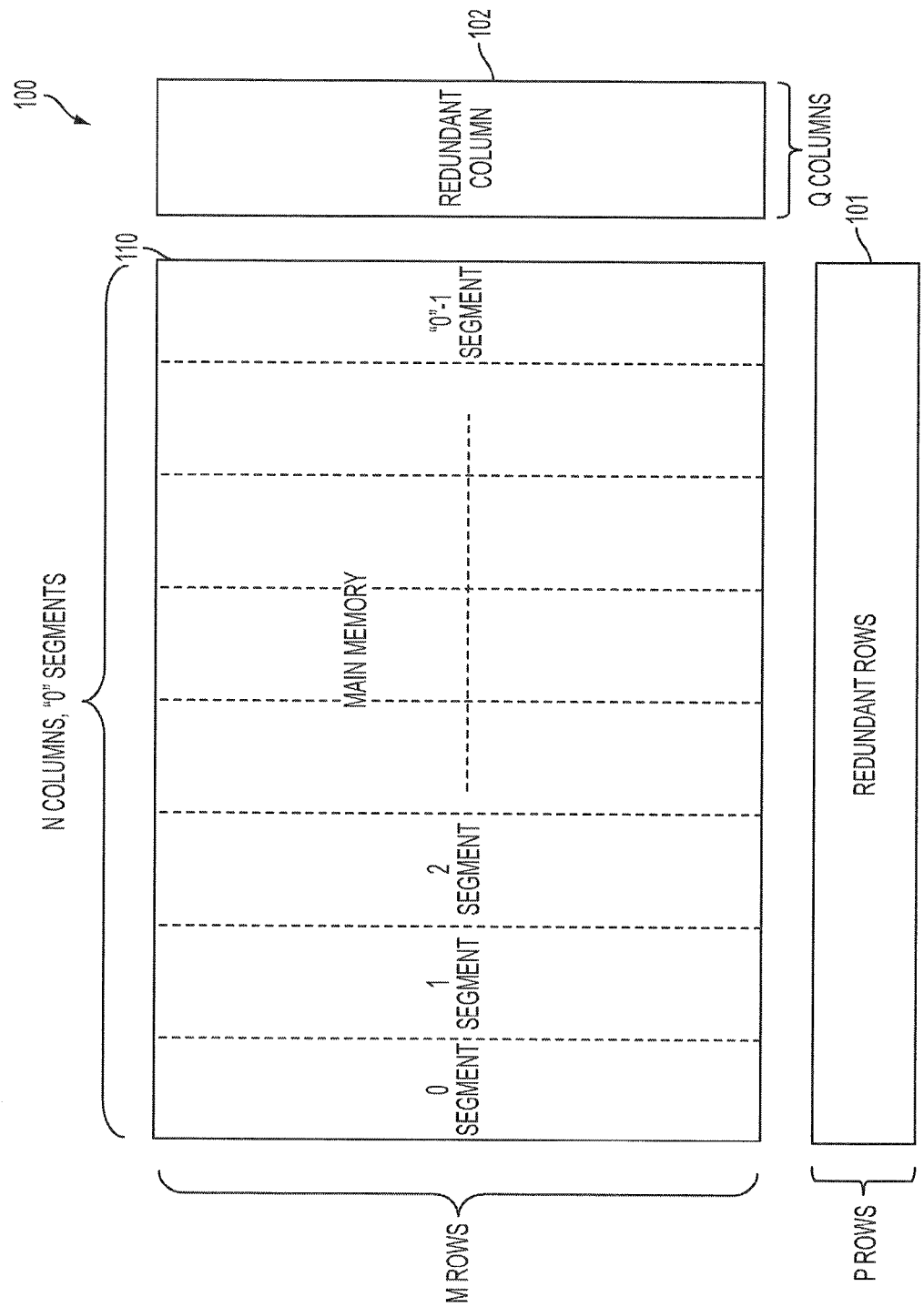
FIG. 1A shows a memory array with redundant rows and columns, in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

As mentioned above, the defect concern in the embedded RAM makes testing necessary. In addition, the embedding of RAM not only makes its own testing difficult, but also impairs testability of all other functions on chip, such as the core logic. For example, much of the testing of other functions requires the use of the embedded RAM, which must be functioning properly. The RAM yield problems may be tackled by incorporating a repair scheme with redundant rows and/or columns. If an embedded memory is buried deeply within an ASIC or SOC device, built-in self-test (BIST) and built-in self-repair (BISR) have been used to assist memory repair. However, there are limitations of the existing BIST and BISR mechanisms to meet the requirement of memory repair for advanced devices.

FIG. 1A shows a memory array 100 with redundant rows and columns, in accordance with some embodiments. The memory array 100 could be a part of a memory chip or could be a part of an ASIC or SOC device. Memory array 100 includes a main memory 110, redundant rows 101 and redundant columns 102. The main memory 110 has M rows and N columns. M and N can be any integer number. The values of M and N determine the size of the main memory 110. For example, the main memory 110 may have 288 columns and 512 rows. Other numbers of columns and rows are also possible. In some embodiments, the main memory 110 may be further divided into a number of segments, such as O segments. O can be any integer number. In some embodiments, the segments are equal in size. For example, main memory 110 could have 8 segments, which are divided by columns. Using the exemplary main memory 110 described above, each segment has 36 columns if there are 288 columns and 8 segments. FIG. 1A shows that the main memory 110 has 0, 1, 2, . . . "O"-1 segments.

The redundant rows 101 and the redundant columns 102 are rows and columns of memory cells that are used for repairing failed cells in the main memory 110. In some embodiments, the redundant rows 101 are used for row repair and the redundant columns 102 are used for column repair. The numbers of redundant rows 101 and columns 102 depend on the size of main memory 110 and also on the manufacturing processes used to make main memory 110 and its size. Larger main memory 110 (with more rows and columns) may require more redundant rows and columns to assist in cell repair. In addition, if the processes used to manufacture the device have high yield, the numbers of redundant rows and columns could be lower. In contrast, if the processes have low yield, the numbers of redundant rows and columns needed would be higher. As shown in FIG. 1A, the main memory 110 has P redundant rows and Q redundant columns. P and Q are integers. P is smaller than M and Q is smaller than N, in accordance with some embodiments. For example, if there are 288 columns and 512 rows in main memory 110, there could be 16 redundant rows and 8 redundant columns. Other numbers of redundant rows or columns are also possible. In some embodiments, each redundant column is used to repair failed memory cell(s) in one designated segment. Under such circumstance, Q is equal to O. The memory cell described here may refer to a memory unit, which may comprise a number of transistors.

Figure 1B:
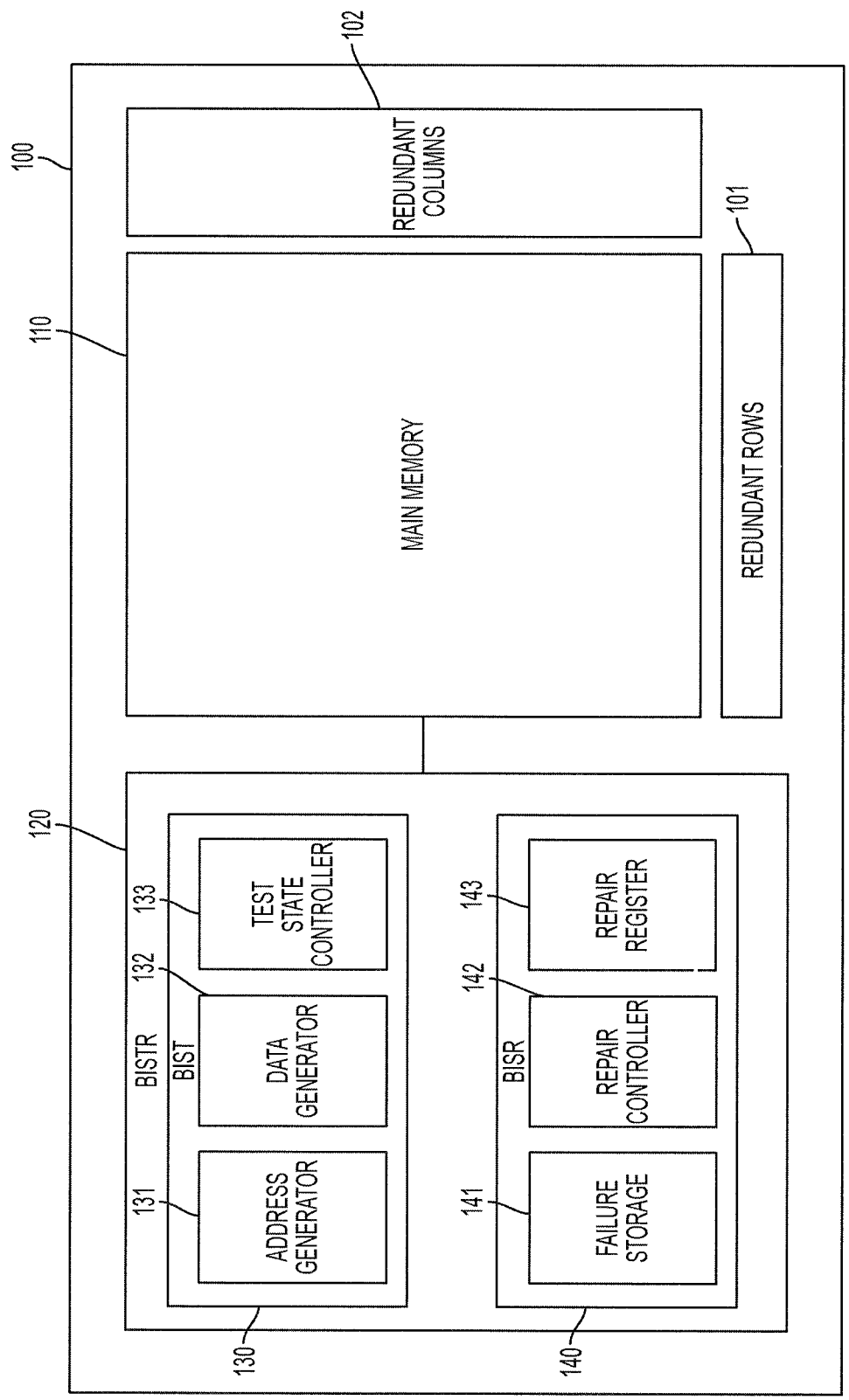
FIG. 1B shows a schematic diagram of a memory array with a built-in self-test-and-repair (BISTR) module, in accordance with some embodiments.

FIG. 1B shows a schematic diagram of the memory array 100 with a built-in self-test-and-repair (BISTR) module 120, in accordance with some embodiments. The BISTR module 120 provides the functions of testing and repairing main memory 110. The BISTR module 120 includes a BIST module 130 for testing the main memory 110 and a BISR module 140 for repairing the main memory 110, in accordance with some embodiments. The BIST module 130 may include an address generator 131, which generates and provides address sequences to the main memory 110 during testing in accordance with some embodiments. The BIST module 130 may further includes a data generator 132, which generates and provides test data sequences to the main memory 110 during testing. The address sequences and the data sequences are generated in orders specified by a test pattern algorithm, in some embodiments. The data sequences may provide a set of data bits to detect various types of faults within the main memory 110. In addition, the BIST module 130 may include a test state controller 133, which provides inputs and control signals to the address generator 131 and the data generator 132. The test pattern algorithm described above may be generated by the test state controller 133. The BIST module 130 may scan the main memory 110 by row, by column, or a combination of both to test the entire main memory 110.

The BISR module 140 may analyze the received error (or failure) data generated from testing the main memory 110. The error (or failure) data may include an address(es) of the error(s) (or failed cells), also possibly along with the other received (or collected) error information, to determine the repair mechanism(s). Depending on the location and distribution of the error data, the repair could be done by row repair and/or column repair. The BISR module 140 may include a failure storage 141, which stores addresses of the failed memory cells. The failure storage 141 may also store the failure types associated with the failed memory cells. However, the storage of the failure types is not necessary.

The BISR module 140 may further include a repair controller 142 and a repair register 143. The repair controller 142 analyzes the failure data stored in failure storage 141 and determines the repair method(s), such as by row repair, by column repair, or by a combination of both. After the repair controller 142 determines the repair method(s), it issues a repair instruction to the repair register 143. The repair instruction may include the address(es) of row(s) and/or column(s) in the main memory 110 being repaired and the address(es) of redundant row(s) and/or redundant column(s) used for the repair(s). The repair register 143 then records the addresses received from the repair controller 142. When the memory array 100 is operated under read or write mode, the read/write address(es) is first checked against the repair addresses stored in the repair register 143 to see if the read/write address(es) is included in the repair register 143. If the answer is yes, the read/write would be performed on a correlated address(es) in the redundant row(s) or column(s) used for the repair.

The repair controller 142 may use a relatively simple "repair-on-the-go" algorithm to repair faulty memory cells. For example, the BISR module 140 may repair the detected failed memory cells as soon as they are discovered. As mentioned above, the BIST module 130 scans the main memory 110 and sends failure information to failure storage 141. The repair controller 142 may initiate repair based on the available failure data in the failure storage 141 before the scanning of the entire main memory 110 is completed. Such repair algorithm is relatively simple to implement and the failure storage 141 required is relatively small. For example, if the test sequences generated by the BIST module 130 identify a particular row of a failed cell, the failure location is sent to the failure storage 141. When the repair controller 142 detects such an error, the repair controller 142 could immediately initiate a row repair. Afterwards, the BISTR 120 continues with the scanning (and testing) and repairing of the remaining portion of the memory. One issue facing such a repair algorithm is that the repair methods used might not be ideal for the failure patterns of the main memory 110, because the repair method is determined based on limited failure data. For example, a row repair might have been used to repair a single error in a row before it is discovered that the column associated with one of the row failure has multiple failures. A column repair would have been a better choice. By using non-optimized or poor repair methods, the redundant rows and/or columns could run out before the entire main memory 110 is scanned. As a result, some failed cells might not be repaired due to lack of redundancy. The built-in self-test-and-repair of the main memory 110 would then be deemed to have failed and the main memory 110 is marked as un-repairable. Therefore, the simple "repair-on-the-go" algorithm is not ideal.

Figure 2A:
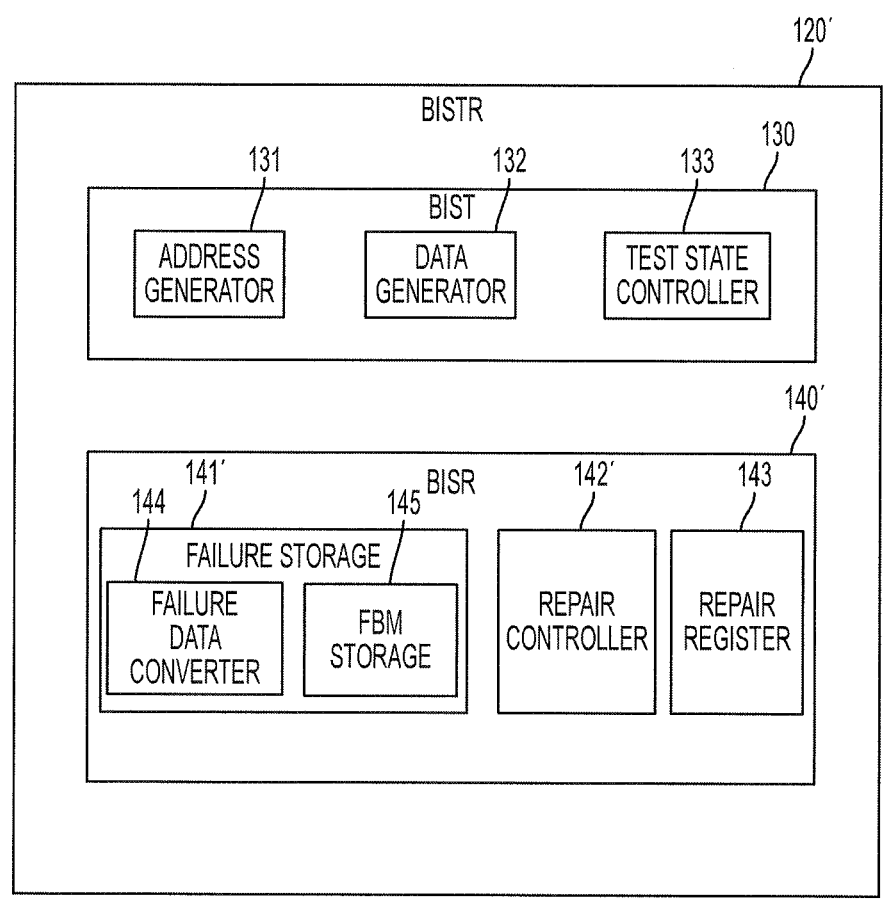
FIG. 2A shows a schematic diagram of a built-in self-test-and-repair (BISTR) module, in accordance with some other embodiments.
Figure 2B:
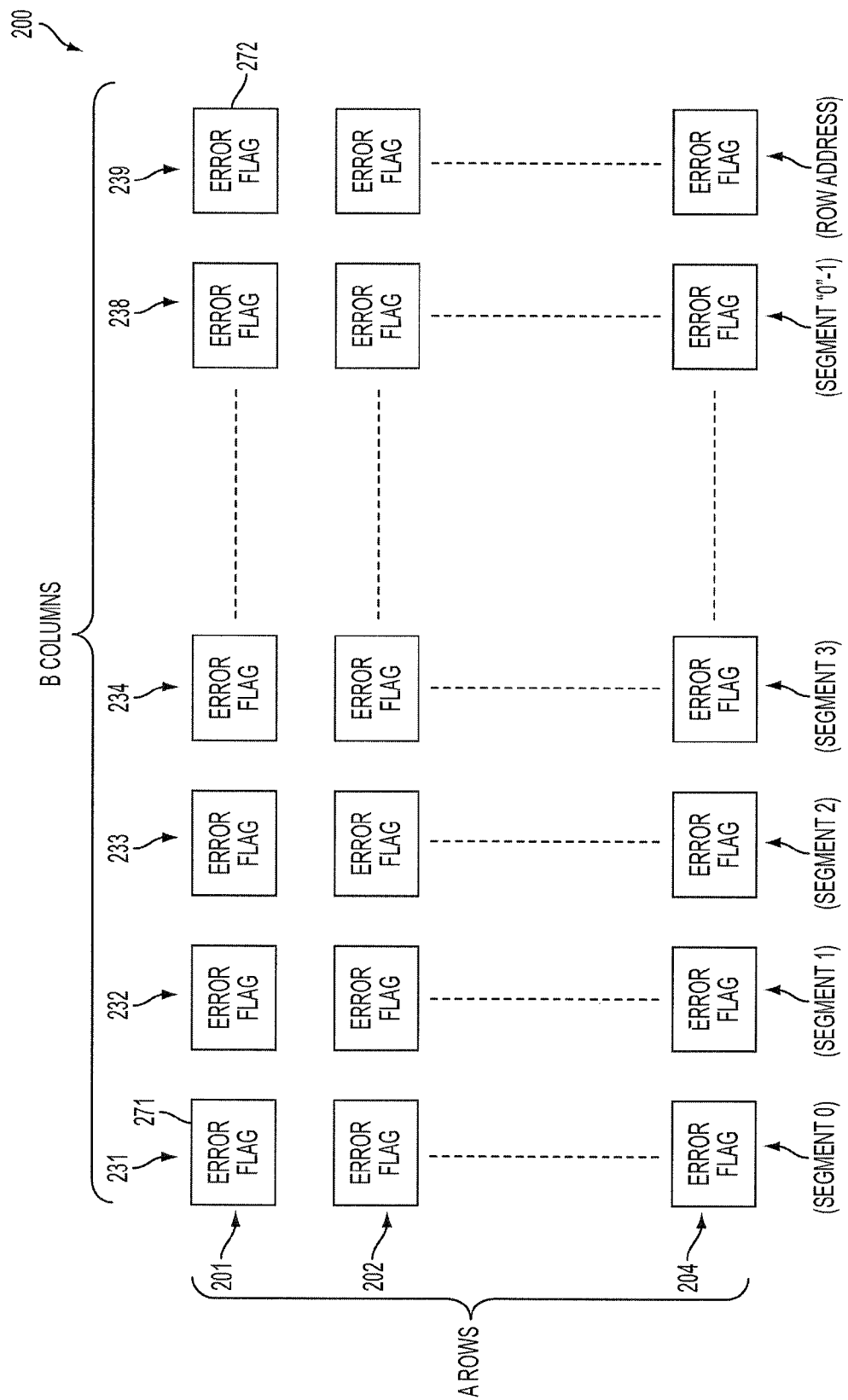
FIG. 2B shows a failure bit map (FBM) data structure, in accordance with some embodiments.

FIG. 2A shows a schematic diagram of a built-in self-test-and-repair (BISTR) module 120', in accordance with some embodiments. The BISTR module 120' may be used to test and repair main memory 110 in a manner similar to the BISTR module 120 described above in many aspects. For example, the BIST module 130 in the BISTR module 120' of FIG. 2A is similar to the memory BIST module 130 of FIG. 1B. However, the repair algorithm of BISR module 140' is different from the repair algorithm of the BISR module 140 described above. The BIST module 140' collects and analyzes one or more failure bit maps (FBMs), which store failure data of the entire main memory 110, before it determines the repair method(s). As shown in FIG. 2B, the BISR module 140' includes a failure storage 141', which includes a failure data converter 144 and a failure bit map (FBM) storage 145, in accordance with some embodiments. The failure data generated from BIST module 130 is stored in the FBM storage 145. To save the memory space required to save the entire main memory 110, the failure data stored in the FBM storage 145 are compressed failure data, which are generated (or converted) by the failure data converter 144 from failure data generated during the testing sequence of BIST 130.

The failure data stored in failure bit map (FBM) storage 145 are stored in bits. For example, if the main memory 110 has 288 columns with 8 segments, each segment has 36 columns, such as columns 0, 1, 2, . . . , 35. Six bits can be used to describe locations of 36 columns. FIG. 2B shows a FBM data structure 200, in accordance with some embodiments. The FBM data structure 200 includes "A" number of rows and "B" number of columns. A and B are both integers. Larger A and B allow storing more failure data with the down side of taking up extra memory space or additional real-estate on the chip. However, if the A and B are too small, it runs the risk of not being able to capture all failure data. In some embodiments, the A number is equal to or greater than the number of repair rows. The number B is equal to the number of repair column +1, in some embodiments. For example, the number A may be in a range from about 16 to about 50, and the number B may be in a range from about 8 to about 50.

For example, the FBM data structure 200 may has 28 rows and 9 columns. Using the example mentioned above with a main memory 110 having 288 columns and 8 segments, 8 out of the 9 columns are used to store error flags of failed cells in 8 segments. Each segment uses one of the 8 columns to record failure data in the segment. The extra column (the $9^{th}$ column) is used to store row addresses of failed cells, as shown in FIG. 2B in accordance with some embodiments. An error flag using "0" to represent no failure and "1" to represent a failure may be used. A single bit can be used to record failure or no-failure in a segment of a particular row. For example, an error flag in field 271 (or column 231 of row 201) is recorded with a "1" to reflect that there are one or more errors in a segment (segment 0) of a particular row. The memories used for such storage (single bit as error flag) are minimized. The row address of the error(s) in segment 0 is recorded in field 272 (or column 239 of row 201). The number of bits required to record the row address depends on the number of rows in the main memory 110. For example, if the main memory has 512 rows, 9 bits are needed to record the row address.

In addition to recording failures or no-failures in segments and rows, the locations (or address) of failed cells need to be recorded to enable repair. The FBM data structure 200 described above records the failed rows and segments. However, the FBM data structure 200 does not record the column addresses of failed cells. Therefore, another data structure, data structure 250, is used to record the column addresses of failed cells. Data structures 200 and 250 are used together to enable the determination of repair method and the repair work.

Figure 2C:
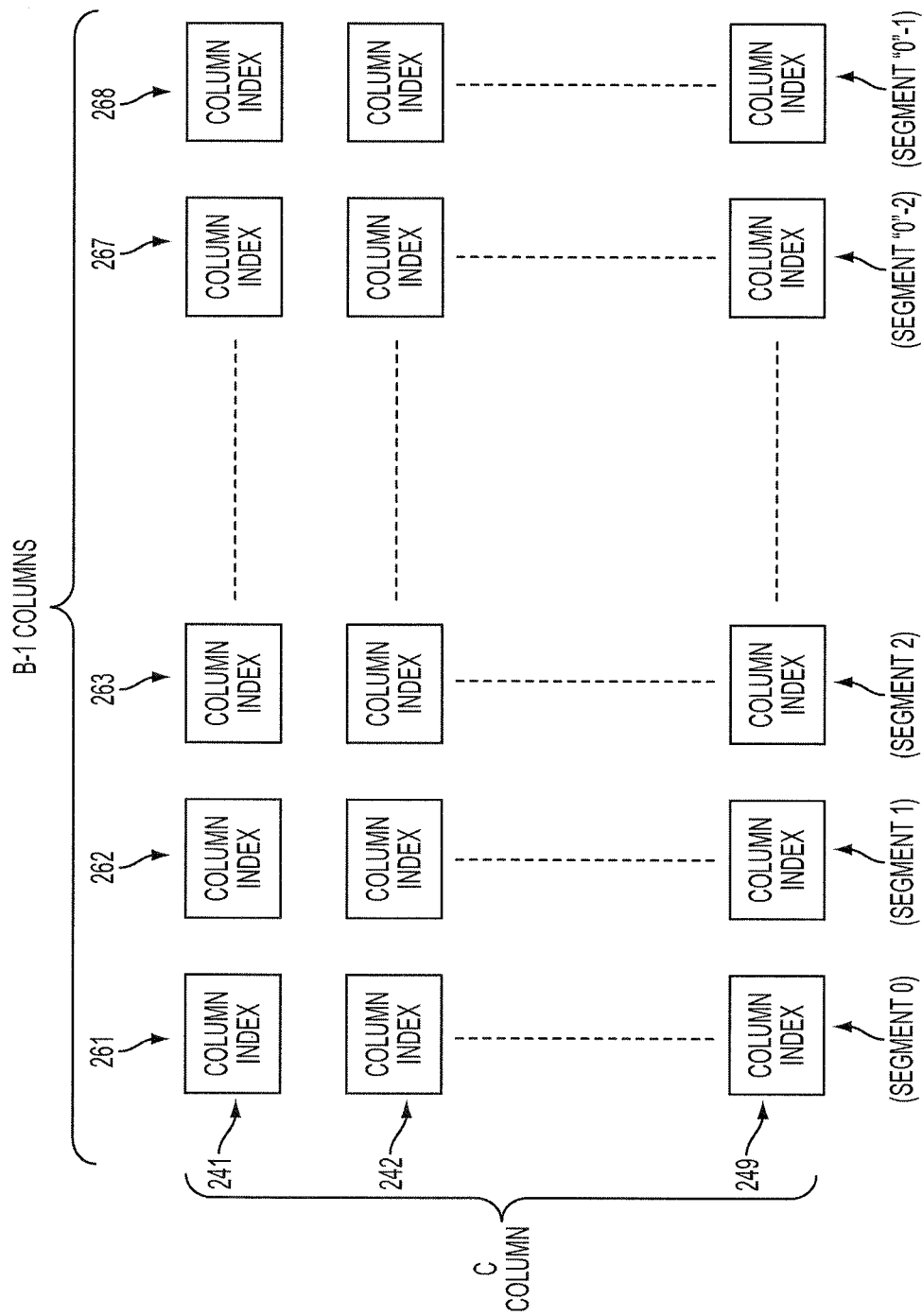
FIG. 2C shows another FBM data structure, in accordance with some embodiments.

FIG. 2C shows data structure 250 for storing column addresses of failed cells, in accordance with some embodiments. For example, FBM data structure 250 may have 9 rows and 8 columns. The column addresses of failed cells are represented by column indexes, represented by bits. If the main memory 110 has 288 columns with 8 segments, each segment has 36 columns, such as columns 0, 1, 2, . . . , 35. 6 bits can be used to describe locations of 36 columns. FIG. 2C shows that the column address data structure 250 has C rows and B-1 columns, in accordance with some embodiments. C is an integer. The column address data structure 250 has one fewer column than data structure 200, because the column for recording the row addresses is not needed. For example, data structure 250 may have 9 rows and 8 columns. Each column is assigned to record column addresses of an assigned segment. For example, column 261 of data structure 250 is assigned to record column addresses of failed cells in segment 0, column 262 of data structure 250 is assigned to record column addresses of failed cells in segment 1, etc. In some embodiments, C is equal to A. However, C may be larger or smaller than A.

The FBM data structures 200 and 250 are populated by the failure test results generated by BIST module 130. Once the failure data start to be collected, or the failure bit maps (FBMs) start to be populated, the repair controller 142' is initiated to analyze the failure data to determine "obvious" repair candidates. Obvious repair candidates refer to failures whose repair methods can be clearly defined without ambiguity before completed collection of data on FBMs, or without complete failure data. For example, if a new error causes a segment violation, the new error can only be fixed by a redundant row. The need of fixing errors having segment violation(s) does not change with additional collection of failure data. Therefore, it is "obvious" that the row that has segment violation needs to be repaired by a redundant row. If the row is repaired right after the row has a segment violation, or new data causing the row to have the segment violation, the remaining un-tested portion of the row can be saved from further testing. As a result, the time and resources, such as storage space, needed for testing the remaining portion of the row and for storing failure results can be saved.

Figure 3A:
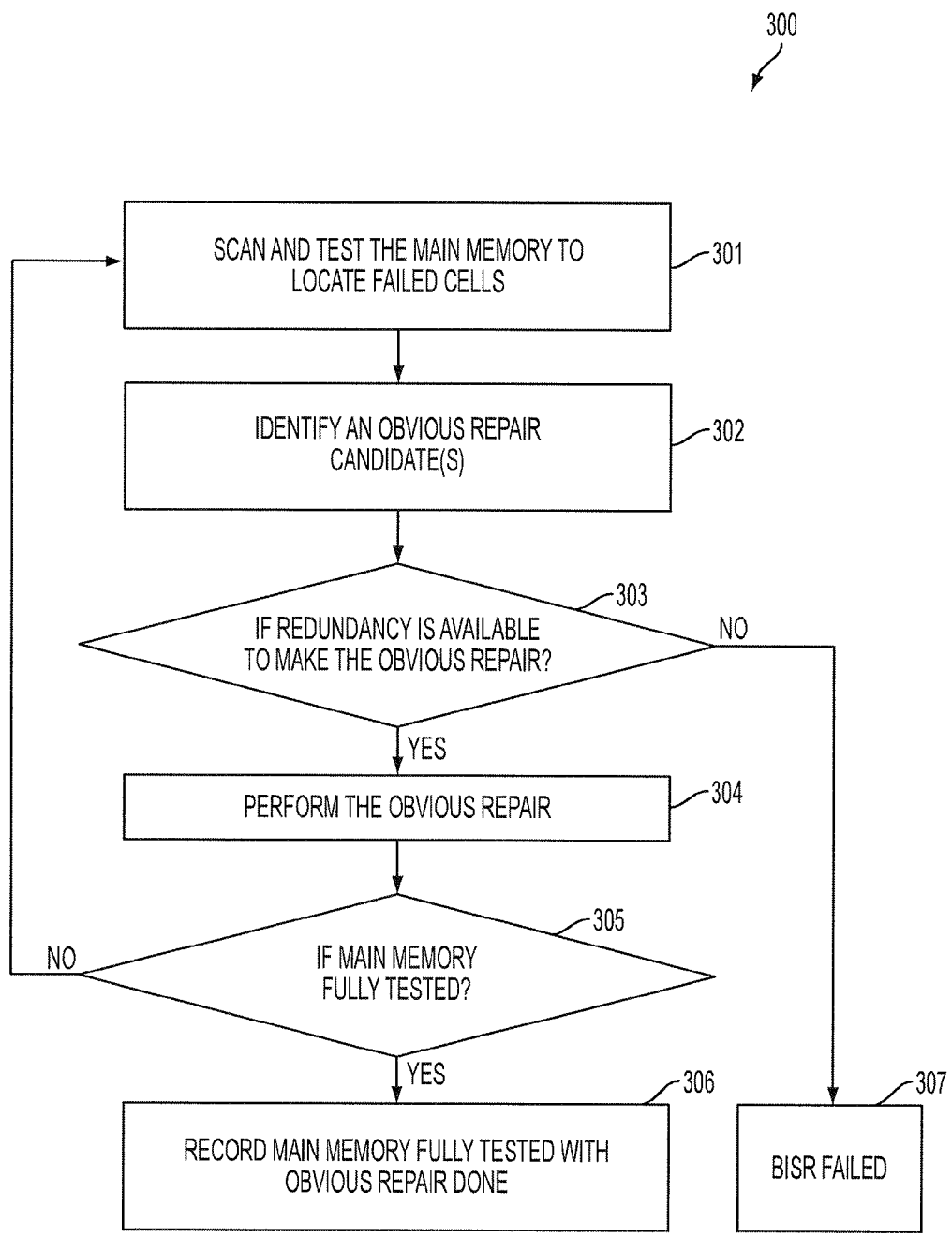
FIGS. 3A and 3B show process flows of collecting data of failed cells of a main memory with obvious repairs, in accordance with some embodiments.

FIG. 3A shows a process flow 300 of collecting (or populating) failed bit map (FBM) data and performing some obvious repair of a main memory, in accordance with some embodiments. At operation 301, main memory 110 is scanned and tested to find (or identify, or locate) failed cells. The memory cells of main memory 110 may be scanned by rows, by columns, or by a combination of rows and columns to identify failed memory cells. The failure locations are stored in data structures, such as data structures 200 and 250. Once the data structures start to be populated, an obvious repair candidate(s) can be identified at operation 302. Once the obvious repair candidate is identified, process flow 300 proceeds to operation 303. At operation 303, a decision is made regarding whether redundancy is available to make the obvious repair. If there is a redundant row/column for the repair, the obvious repair is performed at operation 304. The repair work may include registering the addresses of repaired column(s) and/or row(s) and the addresses of redundancy used, such as in repair register 143. When the main memory is under usage, the control module that accesses the main memory, such as main memory 110, would check the repair register to determine which rows and/or columns have been repaired and where the redundancy rows and/or columns are. Otherwise, the self test and repair have failed and process flow 300 proceeds to operation 307.

After repair is performed at operation 304, process flow 300 proceeds to operation 305, where a decision of whether main memory is fully tested. Not every single memory cell in the main memory 110 needs to be tested. The untested portions of rows and columns that are repaired with redundant rows and columns do not need to be tested, since they are removed from usage. If the testing of main memory 110 has been completed, process flow will then proceed to operation 306, where the main memory 110 is recorded as being fully tested with obvious repairs completed. The failure data collected can then be further analyzed to determine repair methods and to make repair, if sufficient redundant rows and/or columns are available. If the main memory 110 has not been fully tested, process flow 300 returns from operation 305 to operation 301 for additional testing.

Figure 3B:
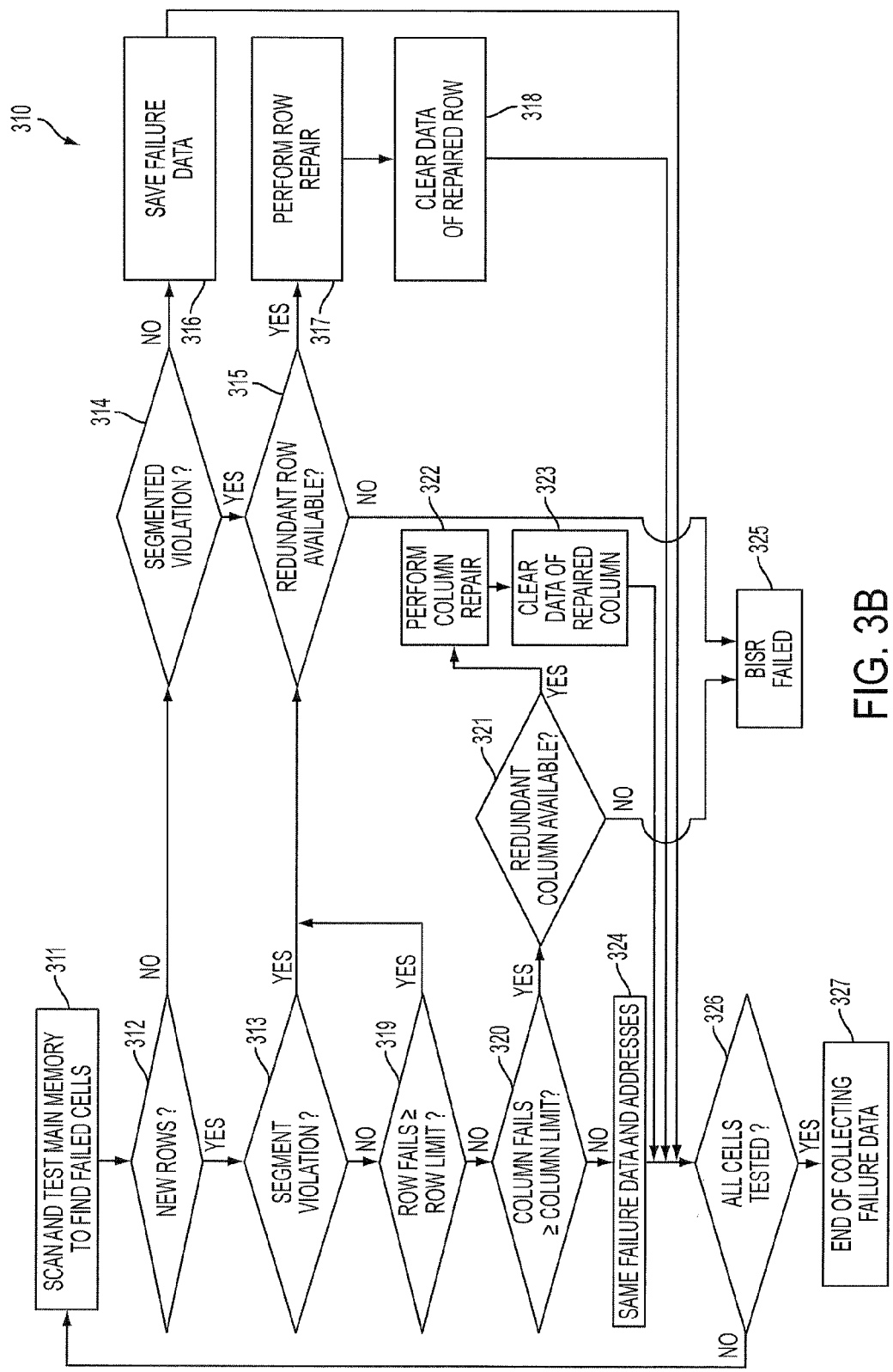

FIG. 3B shows a process flow 310 of testing and repairing collecting a main memory by using a built-in self-test-repair (BISTR) module on a chip, in accordance with some embodiments. In this process flow, a number of exemplary conditions for obvious repair are added in the process flow to describe the testing and repair process. One exemplary condition for an obvious row repair is segment violation. When there are more than one failed columns in a segment of a particular row, the row is said to have a segment violation. As mentioned above, each segment is only assigned a redundant column for repair. If there are more than one failed columns, the repair can only be fixed by row repair. Another possible condition is to set limits on numbers of failures in rows and/or columns. When the number of failures of a particular row exceeds the set limit, row repair is considered necessary. For example, a row failure limit can be set at 4. If there are equal to or greater than 4 failures in a row, the row is considered to have too many failures and repair by a redundant row is considered necessary to repair a significant number of failures from the row. Similar limit can be set for columns. The limits should not be set too low to make the repair methods qualified as obvious.

Process flow 310 starts at operation 311, where the main memory 110 is scanned and tested to find (or identify) failed cells. Once failed cells are identified, a decision of whether the failed cells belong to new rows (i.e. not existing in the data structure) is made at operation 312. If the failed cells do not belong to new rows, the failure data are saved at operation 310. Saving the failure data involves storing the new row address and the row information in data structures 200 and 250. Afterwards, process flow 310 proceeds to operation 326, which will be described below.

If the failed cells belong to new rows, process flow 310 moves to the next operation 313 of determining whether there is a segment violation(s) of the row. When there is more than one failed column in a segment of a particular row, the row is said to have a segment violation. As mentioned above, each segment is only assigned a redundant column for repair. If there is more than one failed column, the repair can only be fixed by row repair.

If there is a segment violation, a decision as to whether a redundant row is available is made at operation 315. If there is no redundant row available, the BISR is considered to have failed at operation 325. If BISR has failed, the BISTR module could take actions to terminate all activities relate to the built-in self test and repair (BISTR).

If it is discovered that there is a redundant row available at operation 315, process flow 310 proceeds to operation 317 of performing row repair. After row repair, the data of the repaired row are cleared from the data structures that are used to store failure information, such as data structures 200 and 250, at operation 318. Afterwards, process flow 310 proceeds to operation 326 of determining if all memory cells have been tested. If the answer is yes, the collection of failure data is considered finished at operation 327. The collection of the failure data is accompanied with obvious repairs. If the answer is no for the question at operation 326, process flow 310 returns to operation 311 to continue scanning and testing the untested portion of the main memory. As mentioned above, the untested portion of rows or columns that have been repaired need not be tested.

If it is determined that there is no segment violation at operation 313, process flow 310 proceeds to operation 319. At operation 319, a decision of whether the number of failures of the rows for the newly identified failed cells is equal to or greater than the row limit is made. As mentioned above, the row limit is defined to be the limit of the number of failures of row for row repair. For example, if the row limit is 5 failures, a row that has failures equal to or greater than about 5 would be repaired by row repair. Similar definition is also made for column limit. Is the decision to the question at operation 319 is "yes," the process flow proceeds to operation 315 to determine whether there is a redundant row for the row repair. The process following operation 315 has been described above. If the number of row fails is smaller than the row limit, process flow proceeds to operation 320, which checks whether there are obvious column repair candidates. If column fails are equal to or greater than the column limit for the decision at operation 320, process flow continues to operation 321, where the availability of the redundant column is checked. If a redundant column(s) is available, repair is performed at operation 322. After the column repair is performed at operation 322, the failure data of the repaired column are cleared from the data structure at operation 323. If it is determined at operation 321 that there is no redundant column available to repair the column identified as an obvious candidate for column repair, the BISR has failed and process flow 310 proceeds to operation 325.

If it is determined at operation 320 that the column fails do not meet the criteria of obvious repair, the process flow 310 continues to operation 324. At operation 324, the failure data are saved (or stored). The failure data are saved in data structures 200 and 250. Operation 324 is followed by operation 326, which has been described above.

FIGS. 1C and 1D show a number of exemplary data in data structures 200 and 250 during the testing and repairing process, in accordance with some embodiments. Table 330 of FIG. 1C shows data structure 200 after collecting some failure data. Table 330 shows that that there are 6 rows that have failed cells. Column 339 shows the addresses of rows that have failures. The addresses are represented by 9 bits. As described above, if the main memory has 512 rows, 9 bits are needed to record the row address. Columns 331-338 are used to indicate whether there are errors in each of the 8 segments. An indicator 0 means there is no error in the segment and an indicator 1 means there is at least one error in the segment. The locations of columns that have failed cells are recorded in data structure 250. An example of such a data structure is table 350, which will be described in more details below. During the testing and obvious repairing process, such as process described in FIGS. 3A and 3B, a new failure has been identified in row 000000111. This new failure is in segment 0, represented by column 331 in Table 330, which already has one failure, as indicated by the "1" in field 388 of Table 330. As a result, the new failure causes segment 0 to have segment violation. As mentioned above, when a row suffers from segment violation, the only method to repair the failures is by row repair. Therefore, a row repair is performed, such as in operation 317 of FIG. 3B. Table 340 shows that after the row repair is performed, the data of row 000000111 is cleared, as shown in row 341. In the example here, row 341 is kept with other fields cleared. However, the entire row 341 may be deleted and the row that has been repaired can have its row address (000000111) registered in another to storage or table.

Table 350 shows data in structure 250 that corresponds to data in Table 340, in accordance with some embodiments. Table 350 has 8 columns and data in each column describe the failure column in a particular segment. For example, the 3 in field 351 indicate that column 3 in segment 0 has a failed cell. The failed cell is in row 000000011 because Table 340 shows an "1" in field 342. Another example is the field 359 of Table 350. Field 359 shows that column 10 of segment 7 has a failure, which correlates to field 343 of Table 340, and the failure is in row 000001000.

Table 360 shows another exemplary table of failure data and the corresponding failure column locations are in table 370 as shown in FIG. 3D. As shown in table 370, there are two errors in column 10 of segment 7. In this example, the column limit for obvious column repair is 3. As a result, when another failure is found in column 10 of segment 7, a column repair is performed. After the repair is performed, the failure data are cleared from the data structures. Table 390 shows that the failure data of row 000001001 are cleared. Table 380 also shows that the addresses of repaired column 10 are removed from the table after the repair.

The discussion and examples described above show that by identifying and performing obvious repair, the time and resources for testing can be saved. Because, the rows and columns that have been repaired for obvious reasons do not need to be tested further. The reduction in testing also saves the storage resources needed. With reduced testing, the failure data would be fewer. Therefore, the storage resources can be reduced. The repaired rows and columns can be recorded as having no failures in the FBMs.

Figure 4A:
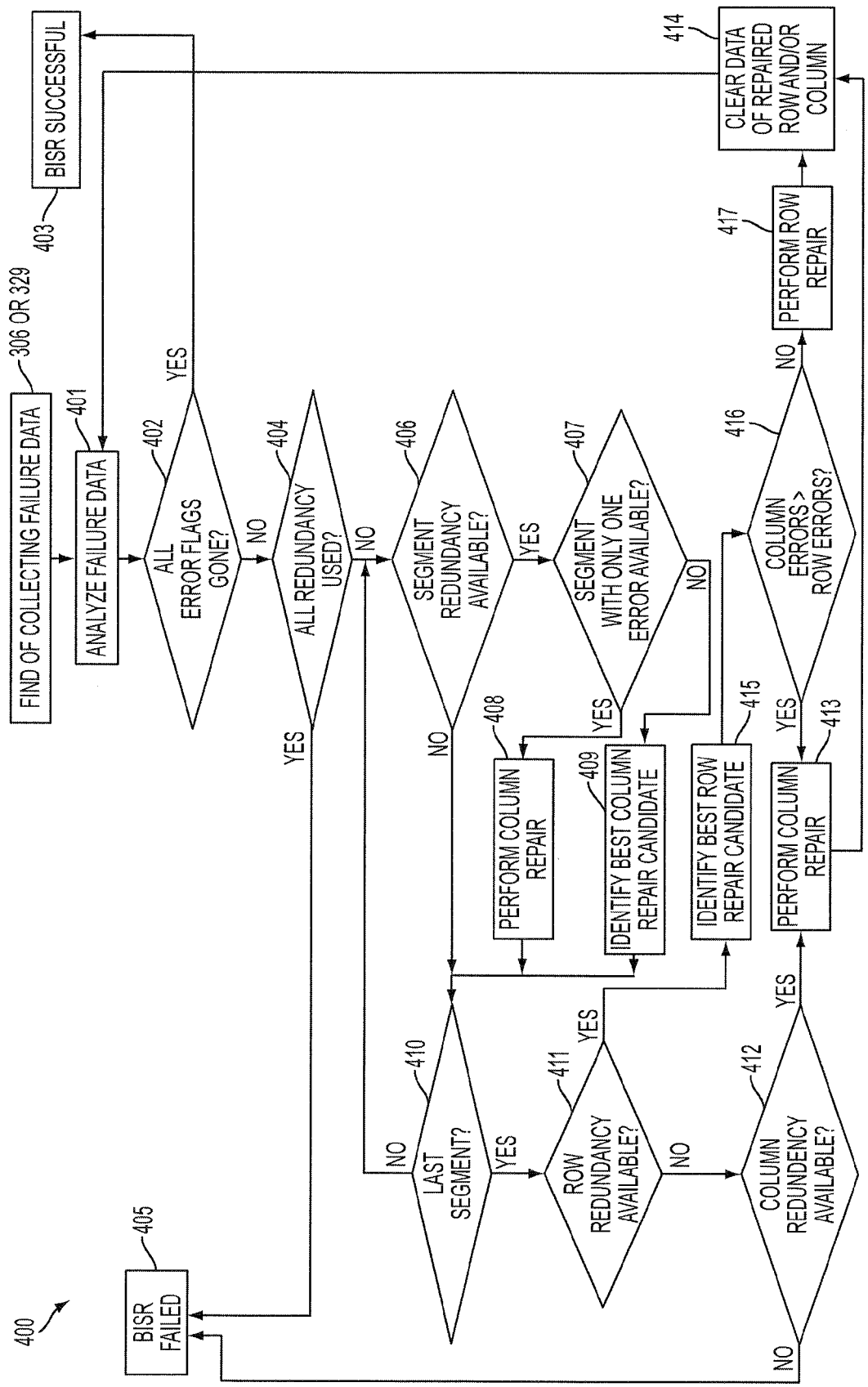
FIG. 4A shows a process flow of repairing failed cells of the main memory, in accordance with some embodiments.

After the failure data are collected, such as according to the process flows 300 and 310 described above, the failures that have not been repaired by obvious repair need to be repaired. FIG. 4A shows a process flow 400 of repairing the remaining failures after the collection of data in FBMs, or failure data in the data structures, of the entire main memory, in accordance with some embodiments. The process flow continues from operation 306 of FIG. 3A or operation 327 of FIG. 3B. Process flow 400 starts at operation 401 of analyzing the failure data collected. After the failure data are analyzed, a decision of whether all error flags are gone is made at operation 402. If all failures are gone, the BISR is considered successful and the process continues to operation 403, where the main memory is recorded as being successfully tested and repaired. If some error flags still exist, process flow moves to operation 404, wherein a decision of whether all redundancy is used is made. If all the redundancy is used, the BISR has failed and is recorded at operation 405. If there is still redundancy, process flow 400 proceeds to the next operation, which is operation 406, which is the part of a decision and repair loop to identify candidates for column repair and/or best column repair candidates.

The decision and repair loop examines each segment until all segments have been reviewed. At operation 406, a decision of whether segment redundancy is available is made for the segment under study. If segment redundancy is available, process flow 400 proceeds to the next operation 407, where a determination of whether the segment under study has only one error at the next operation 407. If the segment has only one error, column repair is performed on the segment at operation 408. Otherwise, a column with the most failures is identified as the best column repair candidate for the segment at operation 409. Operations 408 and 409 are followed by operation 410, where a decision of whether the segment under study is the last segment of the decision and repair loop is made. If the segment is the last segment, which means that every segment has been evaluated, process flow 400 proceeds to operation 411. Otherwise, process flow loops back to operation 406 to analyze and/or repair the next segment.

At operation 411, the availability of row redundancy is evaluated. If there is no row redundancy, the only possible repair mechanism is column repair. As a result, the next operation 412 with no redundancy is operation 412, where the availability of column redundancy is checked. If there is not column redundancy, the self repair has failed and the failure is reflected at operation 405, since the failure(s) cannot be repaired. If there is column redundancy, the failure(s) is repaired by redundant column(s) at operation 413. Afterwards, the data of the repaired column is cleared at operation 414, which continues to operation 401.

If it is determined at operation 411 that row redundancy is available, process flow 400 proceeds to operation 415, where the failure data are analyzed to determine best row repair candidate (or a row with most failures). Afterwards, a decision of whether there are more errors in the column candidate (determined at operation 419) or more errors in the row candidate (determined at operation 415) is made at operation 416. If there are more errors in the column, then column repair is performed at operation 413. Otherwise, row repair is performed at operation 417. As described above, operation 413 proceeds to operation 414. As shown in FIG. 4A, operation 417 also proceeds to operation 414, where the data of the repaired row is cleared.

Figure 4B:
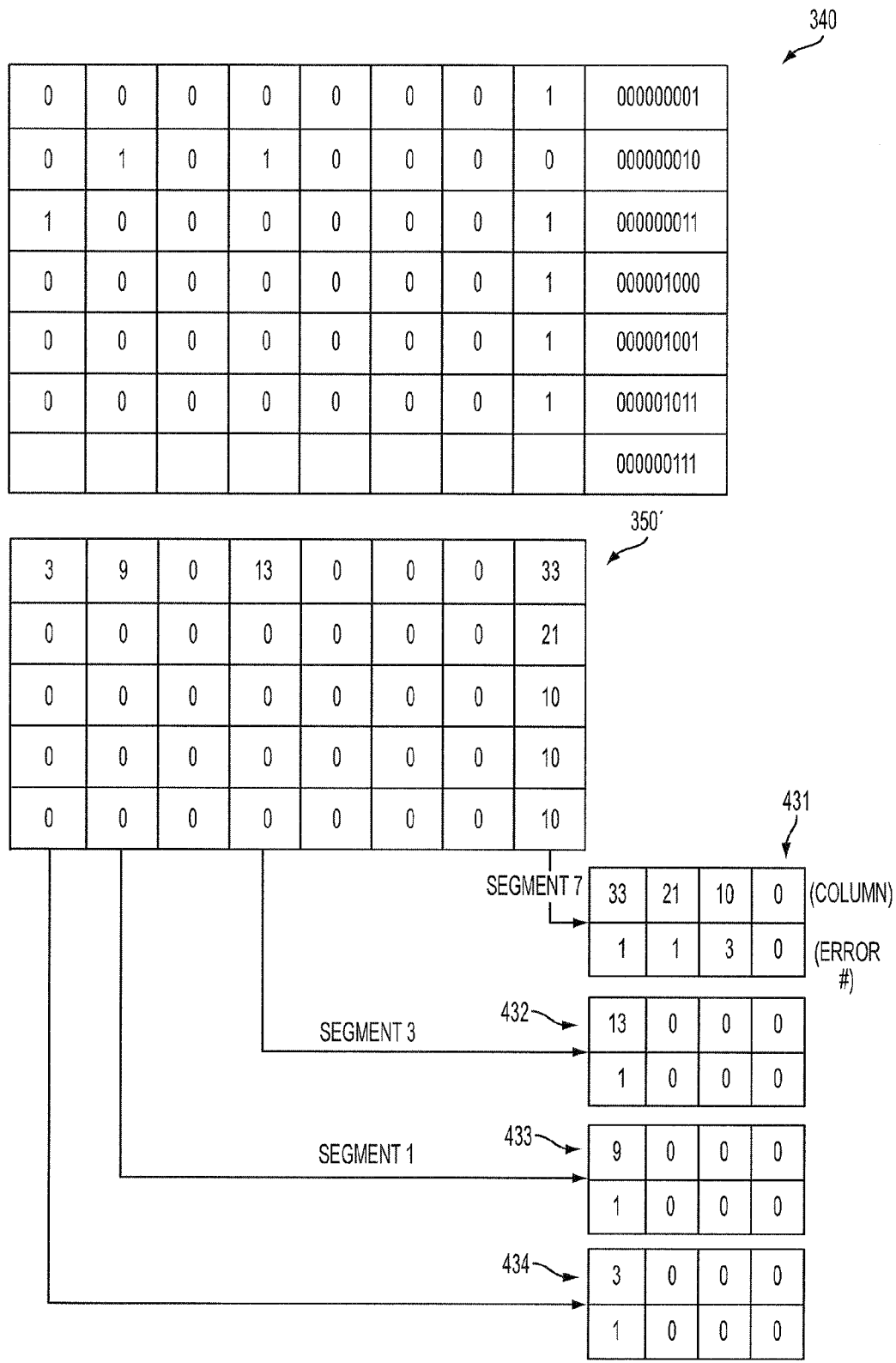
FIGS. 4B and 4C show how data in FBM data structures are used for determining a best candidate for repair, in accordance with some embodiments.

Process flow 400 show how unrepaired column and/or row failures (or errors) can be repaired, in accordance with some embodiments. Operation 416 described above compares numbers of errors in a column and in a row to determine whether to conduct column repair or row repair. FIG. 4B shows exemplary data in data structures (or tables), which are used to perform the comparison. FIG. 4B shows the Tables 340' and 350'. Table 350' correlates to Table 340'. In the example shown in FIG. 4B, the column limit is higher than 3 or there is no column list. As a result, there are 3 errors in column 10 of segment 7. Table 350' is analyzed to identify a column with a maximum number of errors. FIG. 4B shows that the segment data in Table 350 are reduced to 4 segment Tables 431, 432, 433, and 434. Table 431 includes errors in segment 7. The data in Table 431 includes 1 error in column 33, 1 error in column 21, and 3 errors in column 10. Table 432 shows an error in column 13 of segment 3. Table 433 shows 1 error in column 9 of segment 1 and Table 434 shows 1 error in column 3 of segment 0. The results show that column 10 in segment 7 has the highest number of errors (3). As a result, column 10 of segment 7 is considered the best candidate for column repair at operation 409.

The results in FIG. 4B show that by comparing the data in tables (or summaries) reduced from the data structures shown in FIGS. 2B and 2C, the address of the column (column 10 of segment 7) with the maximum number of errors can be identified, in accordance with some embodiments. However, the formation of Tables 431-434 is not necessary in getting such a conclusion. Algorithms without using such tables may also be used to reach such a conclusion. The operation that produces such analysis and result is operation 412 described above.

Figure 4C:
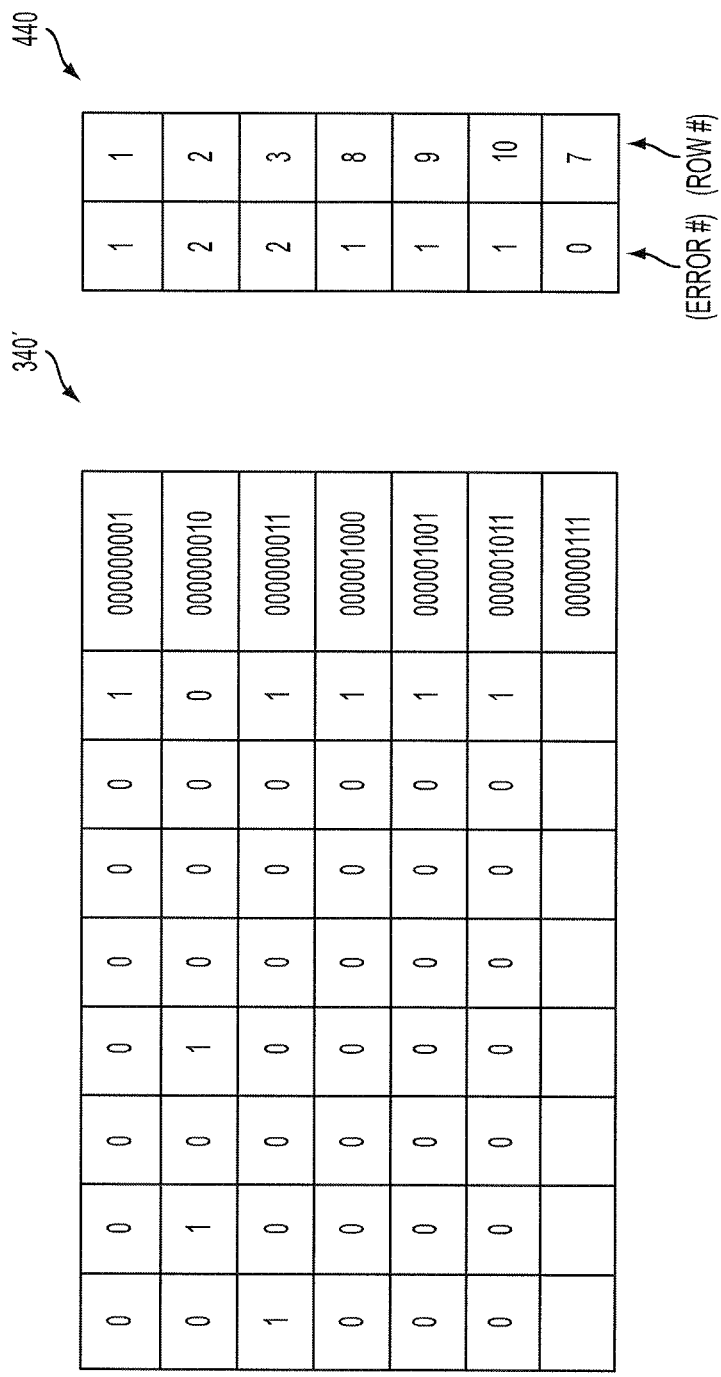

FIG. 4C shows the failure data of Table 340' after it has been reduced to a table 440 with reduced row addresses, in accordance with some embodiments. Table 440 shows that each of rows 1, 8, 9, and 10 has 1 error. Table 440 also shows that rows 2 and 3 both have 2 errors. As a result, the row that has the highest errors is either row 2 (or row 000000010) or row 3 (or row 000000011). Either one can be selected as the best candidate for row repair. For discussion purpose, row 2 is chosen to be the best candidate for row repair at operation 415. Based on results above, the best column repair candidate has higher number of failures (3) than the best candidate for row repair, which has 2 failures, at operation 416. As a result process flow proceeds to operation 413, where column 10 of segment 7 is repaired by a redundant column.

The end result of method 400 is either a completely repaired main memory 110 or a non-repairable main memory 110. In some embodiments, the non-repairable main memory 110 is marked as a lower-grade memory with the addresses of un-repaired rows and/or columns recorded, if there are not too many of them, and can still be sold or used.

The embodiments of mechanisms described may be used to self-test and self-repair any type of RAM, including volatile and non-volatile memories, such as static RAM (SRAM), dynamic RAM (DRAM), or flash memory, etc. The built-in self repair analysis circuit is configurable (parameterizable) to support different sizes and configurations of memories. The repair solutions can be designed to optimize repair efficiency for memories with different sizes and configurations for different test time specifications and different available areas (for test and/or repair devices) on chips. Although the examples described above involve a redundant column for a segment, more than one redundant column may be reserved for a particular segment. When this occurs, the repair methods need to be adjusted accordingly. For example, the criteria of segment violation would be different with the number of columns with failures in a segment adjusted accordingly.

Alternatively, rows can also be divided into segments and redundant rows can be assigned to dedicated segments.

The failure bit map (FBM) data and built-in-self-test-repair (BISTR) module described above enable collecting and analyzing FBM data of the entire memory to identify the best repairing method (or mechanism) to make repairs. By performing obvious repairs during collection of the FBM data, testing and date storage resources can be saved. As a result, the repair method is better and more efficient than algorithms (or method) known to the inventors, which only utilize partial (or incomplete) failure data. The compressed data structures used for the FBMs keep the resources used to capture the FBM data and to repair the failed cells relatively limited.

In some embodiments, a method of self-testing and self-repairing a random access memory (RAM) is provided. The method includes collecting failure data of the RAM with redundant rows and columns. The failure data of all failed cells of the RAM are stored in two failure bit map (FBM) data structures. The RAM is divided into a number of segments. The method also includes performing obvious repair of failed cells during the collecting of the failure data, and analyzing the failure data in the two FBM data structure to determine repair methods. The method further includes repairing failed cells of the RAM by using the redundant rows and columns until either all failed cells are repaired or the redundant rows and columns are all used.

In some other embodiments, a method of self-testing and self-repairing a random access memory (RAM) is provided. The method includes collecting failure data of the RAM with redundant rows and columns. The failure data of all failed cells of the RAM are stored in two failure bit map (FBM) data structures. The RAM is divided into a number of segments, and a first FBM data structure includes a column for row addresses and a plurality of columns for error flags. A second FBM data structure includes a plurality of columns for column indexes corresponding to column addresses of failed cells. The method also includes performing obvious repair of failed cells during the collecting of the failure data, and analyzing the failure data in the two FBM data structures to determine repair methods. The method further includes repairing failed cells of the RAM by using the redundant rows and columns until either all failed cells are repaired or the redundant rows and columns are all used.

In yet some other embodiments, a memory array with a built-in self-test (BIST) module and a built-in self-repair (BISR) module to repair a main memory of the memory array is provided. The memory array includes the main memory, and a first number of redundant rows for row repair of the main memory. The memory array also includes a second number of redundant columns for column repair of the main memory, and the main memory is evenly divided into the second number of segments. Each redundant column is assigned for column repair in an assigned segment. The memory array further includes the BIST module for testing the main memory, and the BISR module for repairing the main memory by using the redundant rows and redundant columns. The BISR module performs obvious repair during testing of the main memory, and the BISR instructs the BISR to stop testing untested portion of columns and rows repaired by obvious repaired. The BISR module performs repairs based on failure bit maps (FBMs) generated from testing the entire main memory.

While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A method of self-testing and self-repairing a random access memory (RAM), comprising:
    collecting failure data of the RAM with redundant rows and columns, wherein the failure data of all failed cells of the RAM are stored in two failure bit map (FBM) data structures; and wherein the RAM is divided into a number of segments;
    performing obvious repair of failed cells during the collecting of the failure data;
    analyzing the failure data in the two FBM data structure to determine repair methods; and
    repairing failed cells of the RAM by using the redundant rows and columns until either all failed cells are repaired or the redundant rows and columns are all used.

2. The method of claim 1, wherein the obvious repair includes repairing failures causing a segment violation.

3. The method of claim 1, wherein the obvious repair includes repairing failures causing column or row failures exceeding a respective column or row limit.

4. The method of claim 1, wherein a first FBM data structure includes a column for row addresses and a plurality of columns for error flags, and wherein a second FBM data structure include a plurality of columns for column indexes corresponding to column addresses of failed cells.

5. The method of claim 4, wherein each of the error flags is represented by a bit reflecting a pass or a fail.

6. The method of claim 1, wherein the number of redundant columns is equal to the number of segments, and wherein each redundant column is used for column repair in an assigned segment.

7. The method of claim 1, wherein the analyzing the failure data in the two FBM data structure to determine repair method further comprises:
    determining if there are sufficient redundant rows to repair rows with a segment violation.

8. The method of claim 1, wherein the analyzing the failure data in the two FBM data structure to determine repair method further comprises:
    identifying segments with only one column fail for column repair.

9. The method of claim 1, wherein the analyzing the failure data in the two FBM data structure to determine repair method further comprises:
    identifying a column with a first maximum number of fails;
    identifying a row with a second maximum number of fails; and
    comparing the first maximum number with the second maximum number to determine a larger number between the two maximum numbers; wherein the column or the row with the larger number is selected for repair.

10. The method of claim 1, further comprising:
    removing the failure data stored in the two FBM data structure of the repaired columns and/or rows after repair.

11. The method of claim 1, wherein the method is configurable to optimize repair efficiency for the RAM with an available area for integrated circuits of the self-testing and self-repair method.

12. The method of claim 4, wherein each of the column indexes has 6 bits and the row address is represented by 9 bits.

13. The method of claim 1, wherein the collecting failure data of the RAM is enabled by a built-in self-test (BIST)

module, and wherein the analyzing and the repairing are performed by a built-in self-repair (BIST) module, and wherein the BIST and the BISR modules are integrated with the RAM.

14. The method of claim 1, wherein the RAM is selected from a group consisting of static RAM (SRAM), dynamic RAM (DRAM), and flash memory.

15. The method of claim 1, wherein the repairing is performed by registering an address of a repaired row or column and the address of the redundant row or column used for the repair, and wherein the FBM data structures are updated after the repairing is performed.

16. A method of self-testing and self-repairing a random access memory (RAM), comprising:
    collecting failure data of the RAM with redundant rows and columns, wherein the failure data of all failed cells of the RAM are stored in two failure bit map (FBM) data structures; and wherein the RAM is divided into a number of segments, wherein a first FBM data structure includes a column for row address and a plurality of columns for error flags, and wherein a second FBM data structure includes a plurality of columns for column indexes corresponding to column addresses of failed cells;
    performing obvious repair of failed cells during the collecting of the failure data;
    analyzing the failure data in the two FBM data structure to determine repair methods; and
    repairing failed cells of the RAM by using the redundant rows and columns until either all failed cells are repaired or the redundant rows and columns are all used.

17. A memory array with a built-in self-test (BIST) module and a built-in self-repair (BISR) module to repair a main memory of the memory array, comprising:
    the main memory;
    a first number of redundant rows for row repair of the main memory;
    a second number of redundant columns for column repair of the main memory, and wherein the main memory is evenly divided into the second number of segments and each redundant column is assigned for column repair in an assigned segment;
    the BIST module for testing the main memory; and
    the BISR module for repairing the main memory by using the redundant rows and redundant columns, wherein the BISR module performs obvious repair during testing of the main memory, and wherein the BISR instructs the BISR to stop testing untested portion of columns and rows repaired by obvious repairs, and wherein the BISR module performs other repairs based on failure bit maps (FBMs) generated from testing the entire main memory.

18. The memory array of claim 17, wherein the BIST module includes an address generator, a data generator, and a test state controller, wherein a test pattern controlled by the test state controller is generated by the address generator and the data generator.

19. The memory array of claim 17, wherein the BIST module includes a failure storage for storing failure data, a repair controller for analyzing the failure data to determine the repair method, and a repair register for registering the repaired rows and columns and the redundant columns and rows used, and wherein the failure storage includes the FBMs, and wherein the FBMs are updated after any repair is performed.

20. The memory array of claim 19, wherein the failure storage further includes a failure data converter, wherein the failure data converter generates compressed failure data to be stored in a data structure for the FBM.

* * * * *